United States Patent
Noguchi

(10) Patent No.: US 6,761,362 B2
(45) Date of Patent: Jul. 13, 2004

(54) WAFER HOLDING DEVICE

(75) Inventor: Ikuo Noguchi, Tokyo-to (JP)

(73) Assignee: Kabushiki Kaisha TOPCON, Tokyo-to (JP)

( * ) Notice: Subject to any disclaimer, the term of this patent is extended or adjusted under 35 U.S.C. 154(b) by 0 days.

(21) Appl. No.: 10/121,230

(22) Filed: Apr. 12, 2002

(65) Prior Publication Data

US 2002/0153676 A1 Oct. 24, 2002

(51) Int. Cl.[7] .............................................. B23B 31/18
(52) U.S. Cl. ........................ 279/106; 118/503; 118/730; 134/149; 134/153
(58) Field of Search ................................ 279/106, 131; 118/503, 730; 134/149, 153, 902; 356/237.4, 237.5, 244

(56) References Cited

U.S. PATENT DOCUMENTS

| | | | | |
|---|---|---|---|---|
| 5,040,484 A | * | 8/1991 | Mears et al. ................. | 118/503 |
| 5,421,056 A | * | 6/1995 | Tateyama et al. ............ | 279/106 |
| 5,954,072 A | * | 9/1999 | Matusita ...................... | 134/149 |
| 5,974,681 A | * | 11/1999 | Gonzalez-Martin et al. ... | 34/58 |
| 6,217,034 B1 | * | 4/2001 | Smedt et al. ................ | 279/106 |
| 6,578,853 B1 | * | 6/2003 | Treur et al. .................. | 279/121 |

* cited by examiner

Primary Examiner—Daniel W. Howell
(74) Attorney, Agent, or Firm—Nields & Lemack

(57) ABSTRACT

A wafer holding device, comprising a rotating baseplate, a wafer seat which is provided on the rotating baseplate coaxially with the rotating baseplate and which receives a peripheral edge of a wafer by a circumference, a predetermined number of chuck levers rotatably mounted on the wafer seat so that the chuck levers can be rotated around an axis extending in a tangential direction on a circumference of the rotating baseplate, and springs for resiliently pushing an end of the chuck lever toward the wafer seat, wherein the peripheral edge of the wafer received on the wafer seat is pinched by the wafer seat and the chuck lever.

8 Claims, 14 Drawing Sheets

WAFER HOLDING DEVICE

BACKGROUND OF THE INVENTION

The present invention relates to a wafer holding device in a surface inspection system to be used in an inspecting process for manufacture of semiconductor products.

A semiconductor product is manufactured by forming a large number of semiconductor devices on a wafer. Because of the requirements on high density and high integration, increasingly finer fabrication is needed. Further, for the purpose of improving the production yield, a wafer with an increasingly larger diameter is now being produced.

With the progress of high density, high integration and finer production, particles attached on the wafer exert extensive influence on the product quality and the production yield. For this reason, the inspecting process is incorporated in the manufacturing process of semiconductor products. A surface inspection of the wafer is performed by using an inspection system, and attaching condition of the particles on the wafer and damage of the wafer are inspected.

In the surface inspection for the wafer, the wafer is rotated at high speed. A laser beam is irradiated to the wafer surface and is scanned in a circumferential direction. The laser beam reflected from the wafer surface is received, and the attachment of the particles, etc. is detected by examining the reflecting condition.

As described above, the wafer is now being produced with increasingly larger diameter. Further, there are demands to improve the throughput and to improve the productivity, and wafer rotating speed during the inspecting is also increased. Therefore, during the inspecting of the wafer, high centrifugal force is applied on the wafer held in the device.

In this respect, a wafer holding device must reliably hold the wafer even at high-speed rotation under high centrifugal force applied.

Description will be given below on a conventional type wafer holding device referring to FIG. 18 and FIG. 19.

A wafer chuck 1 is provided on an upper end of a rotation shaft (not shown).

The wafer chuck 1 comprises a shaft 2 connected to the rotation shaft and a vacuum suction unit 3 in a disk-like shape. A number of circumferential grooves 4 are formed coaxially on an upper surface of the vacuum suction unit 3. A radial groove 5 is formed in a radial direction, and the circumferential grooves 4 are communicated with the radial groove 5. The shaft 2 is designed with a hollow portion 6, and it is communicated with a vacuum pumping equipment (not shown) via the hollow portion 6.

When the wafer 7 is chucked, the wafer 7 is received so that the wafer 7 is coaxially aligned on the vacuum suction unit 3. The wafer 7 has a diameter larger than the diameter of the vacuum suction unit 3, and the peripheral portion is protruded. When the wafer 7 is received, each of the circumferential groove 4 and the radial groove 5 is turned to a closed space. By performing vacuum pumping through the hollow portion 6, the inner spaces of the circumferential groove 4 and the radial groove 5 are turned to negative pressure. By the pressure difference from outside, the wafer 7 is sucked and held by the vacuum suction unit 3.

However, in the conventional wafer holding device, as shown in FIG. 20, when the wafer 7 is sucked by the vacuum suction unit 3, the wafer 7 is supported by convex portions 8 in arcuate shapes between the circumferential grooves 4, and the external pressure is applied on the entire surface of the wafer 7. As a result, delicate and complicated flexion occurs between the convex portions 8 and 8. Also, the portion protruding from the vacuum suction unit 3 is bent downward by its one weight. In case the election is irregular, a direction of the laser beam reflected from the surface of the wafer 7 is changed irregularly. From the laser beam reflected from the normal surface, particles and surface abnormality are erroneously detected. This may cause erroneous measurement.

The convex portions 8 are brought into contact with an entire rear surface of the wafer 7, and high contact pressure is applied on the contact portion. This may lead to generation of damage and also to the possibility that foreign objects may be attached on the rear surface of the wafer 7.

Also, close contact between the wafer 7 and the convex portions 8 exerts strong influence on adsorption of the wafer 7. When foreign objects are attached on a contact surface of the convex portion 8, adsorption is decreased. As a result, the wafer 7 may not be aligned with the center of the vacuum suction unit 3 due to angular acceleration at the initiation of rotation or at the stopping of the vacuum suction unit 3. When the wafer 7 is rotated at high speed, high centrifugal force is applied on the wafer. When the wafer 7 is not aligned well with the vacuum suction unit 3 or the center of the wafer 7 is deviated at the time of attaching, the wafer 7 may be detached from the vacuum suction unit 3.

SUMMARY OF THE INVENTION

It is an object of the present invention to provide a wafer holding device, by which it is possible to reliably hold a wafer even during high-speed rotation and to prevent the development of complicated flexion on the surface of the wafer when the wafer is held in the device.

To attain the above object, the wafer holding device according to the present invention comprises a rotating baseplate, a wafer seat which is provided on the rotating baseplate coaxially with the rotating baseplate and which receives a peripheral edge of a wafer by a circumference, a predetermined number of chuck levers rotatably mounted on the wafer seat so that the chuck levers can be rotated around an axis extending in a tangential direction on a circumference of the rotating baseplate, and springs for resiliently pushing an end of the chuck lever toward the wafer seat, wherein the peripheral edge of the wafer received on the wafer seat is pinched by the wafer seat and the chuck lever. Also, the present invention provides the wafer holding device as described above, wherein a wafer receiving surface of the wafer seat has a downslope gradient toward a center of the rotating baseplate, and a wafer abutting surface of the chuck lever has an upslope gradient toward the center. Further, the present invention provides the wafer holding device as described above, wherein the chuck lever is extended above and under the rotating baseplate, an outer end of a chuck shaft slidably provided in a radial direction is engaged with a lower end of the chuck lever, an inner end of the chuck shaft is engaged with a chuck disk provided coaxially with the rotating baseplate, the chuck shaft is displaced in the radial direction by rotation of the chuck disk, and the chuck lever is rotated. Also, the present invention provides the wafer holding device as described above, wherein centrifugal force applied on a lower half of the chuck lever is designed to be bigger than centrifugal force applied on an upper half of the chuck lever. Further, the present invention provides the wafer holding device as described above, wherein the wafer seat has at least three notches, and there is provided a delivery pin which is positioned on each of the notches, which is movable in a vertical direction on the same circumference as the wafer seat, and which receives the wafer above the wafer seat. Also, the present invention provides the wafer holding device as described above, wherein the device comprises a cylinder cam rotatably mounted with respect to the delivery pin, a chuck disk rotatably provided coaxially with the rotating baseplate, and a link bar for connecting the chuck disk with the cylinder cam, wherein the cylinder cam is rotated via the link bar by rotation of the chuck disk, and the delivery pin is moved up or down by rotation of the cylinder cam.

DETAILED DESCRIPTION OF THE PREFERRED EMBODIMENT

Figure 1:
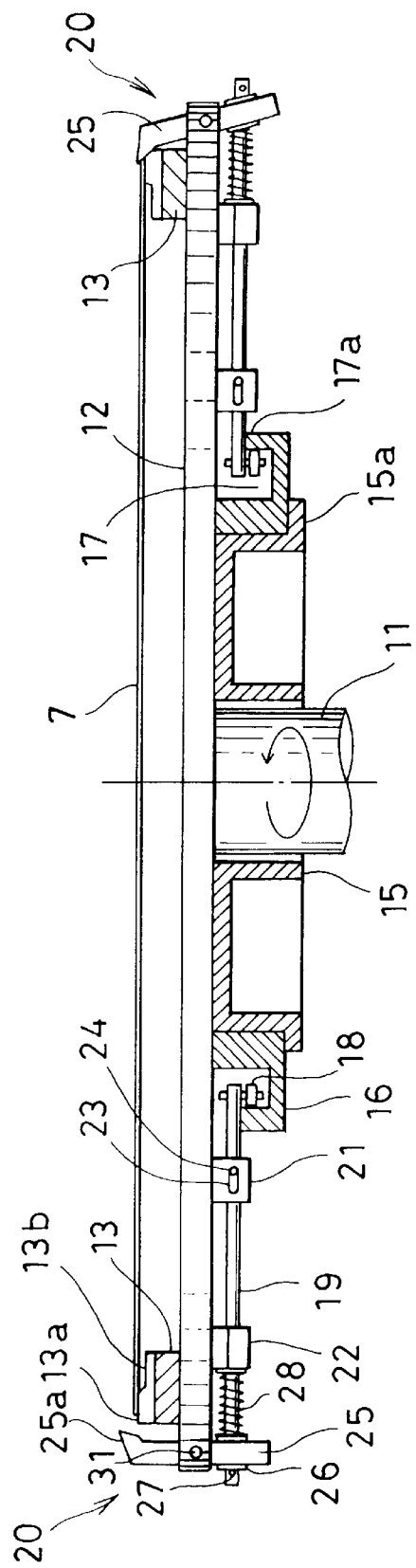
FIG. 1 is a sectional view seen from a front side of a first embodiment of the present invention.

Description will be given below on a first embodiment of the present invention referring to the drawings.

Figure 2:
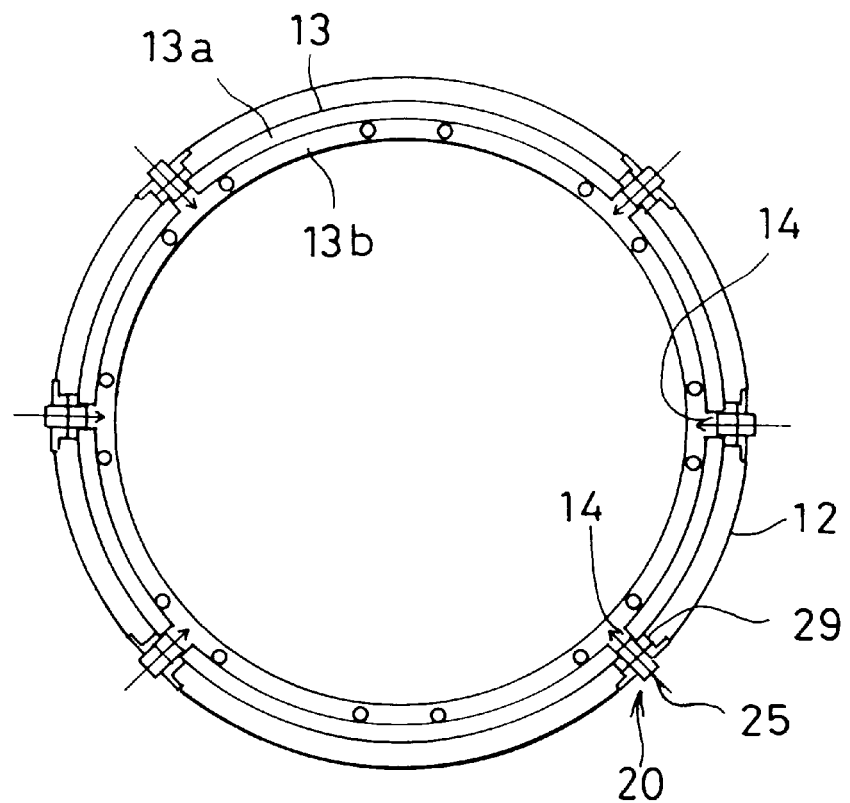
FIG. 2 is a plan view of the first embodiment as given above.
Figure 3:
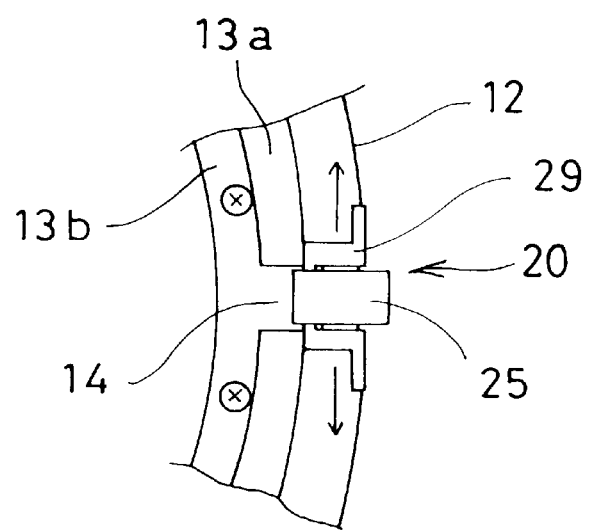
FIG. 3 is a plan view of a part of a chuck lever in the first embodiment.

FIG. 1 to FIG. 3 each represents an essential portion of a wafer holding device in the first embodiment. To facilitate the explanation, the left half of FIG. 1 shows the condition where a wafer is opened, and the right half shows the condition where the wafer is chucked.

A rotating baseplate 12 in circular shape is fixed on a rotation shaft 11 of a motor, and a wafer seat 13 in a ring-like shape is fixed coaxially with the rotating baseplate 12 on an upper surface of the rotating baseplate 12. The wafer seat 13 has a diameter larger than a diameter of the wafer which is to be placed on the wafer seat 13, and the rotating baseplate 12 is designed in such manner that its peripheral portion is further extended and protruded by a predetermined extent from the wafer seat 13.

On an upper surface of the wafer seat 13, a wafer receiving surface 13a and an escape surface 13b lower than the wafer receiving surface 13a are provided, and the wafer receiving surface 13a is designed in a conical curved surface with a downslope gradient toward the center.

On the wafer seat 13, notches 14 are formed at predetermined points (6 points except 2 points opposing to each other among 8 equally divided points of the circumference as shown in FIG. 2). Each of the notches 14 is formed in a rectangular groove from the upper surface of the wafer seat 13. The position of each of the notches 14 is on a radius of the rotating baseplate 12, and each pair of notches are at symmetrical positions with respect to the center of the rotating baseplate 12. A wafer clamper 20 (to be described later) is provided on the notch 14.

On a rear surface of the rotating baseplate 12, a cam holder 15 coaxial with the rotating baseplate 12 is fixedly mounted. The cam holder 15 is designed in a hollow shape so as to reduce an inertial force, and a flange 15a is formed on its lower end. A chuck disk 16 in a doughnut-like shape is rotatably mounted on the outer side of the cam holder 15, and the movement in an axial direction is restricted by the flange 15a and the rotating baseplate 12. The chuck disk 16 is reciprocally rotated at a predetermined angle by a chuck switching means (not shown).

On the chuck disk 16, a cam groove 17 is formed from an upper surface. Thickness of an outer wall 17a of the cam grove 17 is changed in a circumferential direction within a predetermined range, and a recess 17b is formed. On the outer wall 17a, a cam follower 18 (to be described later) is rotatably abutted.

To match the position of each of the notches 14, a chuck shaft 19 is disposed on the lower side of the rotating baseplate 12, and an axis of the chuck shaft 19 runs in parallel to the radius of the rotating baseplate 12 where the notch 14 is provided. The chuck shaft 19 is slidably supported by bearing blocks 21 and 22. A guide hole 23 is formed on a lateral side of the bearing block 21, and a guide pin 24 studded on the chuck shaft 19 is slidably engaged in the guide hole 23.

On one end of the chuck shaft 19 closer to the center, the cam follower 18 is rotatably mounted, and an outer end of the chuck shaft 19 is freely penetrating through a chuck lever 25 (to be described later). On a protruded end of the chuck lever 25, a washer 26 is mounted, and a pin 27 is further fixed, and the washer 26 is prevented from falling off by the pin 27. A compression spring 28 is positioned between the bearing block 22 and the chuck lever 25, and the spring resiliently pushes the chuck shaft 19 and the lower end of the chuck lever 25 in an outward direction. Therefore, the cam follower 18 is abutted on the outer wall 17a by a resilient force of the compression spring 28.

On an outer edge of the rotating baseplate 12, a notch in a rectangular shape is formed to be in contact with the notch 14, and the chuck lever 25 is mounted on the notch via a holder 29. The chuck lever 25 is pivotally mounted on the holder 29 by a pin 31, which has an axis in a tangential direction on the circumference of the rotating baseplate 12, and the chuck lever 25 is removably engaged with the notch 14. The chuck lever 25, the holder 29 and the pin 31 make up together the wafer damper 20.

The lower half of the chuck lever 25 is extended in a downward direction from the rotating baseplate 12. Its upper half is extended in an upward direction from the rotating baseplate 12. It is designed in such manner that, when centrifugal force is applied on the upper half and the lower half of the chuck lever 25, the centrifugal force applied on the lower half is slightly bigger than the force applied on the upper half.

As described above, the lower end of the chuck lever 25 is engaged with the chuck shaft 19. On the upper end of the chuck lever 25, a wafer presser 25a in a beak-like shape and protruding toward the center is provided. The lower surface of the wafer presser 25a is designed as an inclined surface with an upslope gradient toward the center.

Now, description will be given on operation of the wafer chuck referring to FIG. 4 to FIG. 9.

Figure 4A:
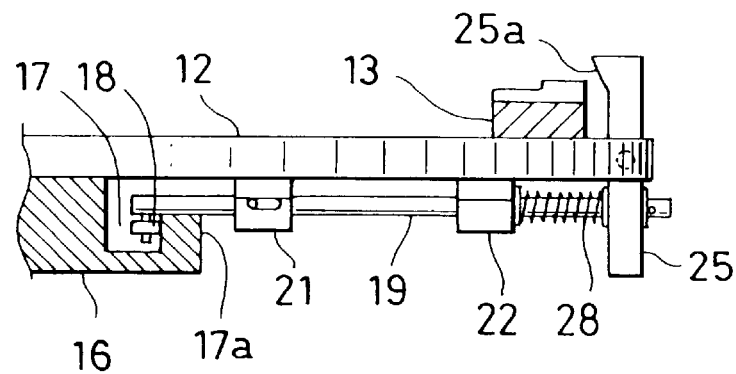
FIG. 4 (A) and FIG. 4 (B) each represents a front view for explanation showing operation of a wafer chuck.
Figure 4B:
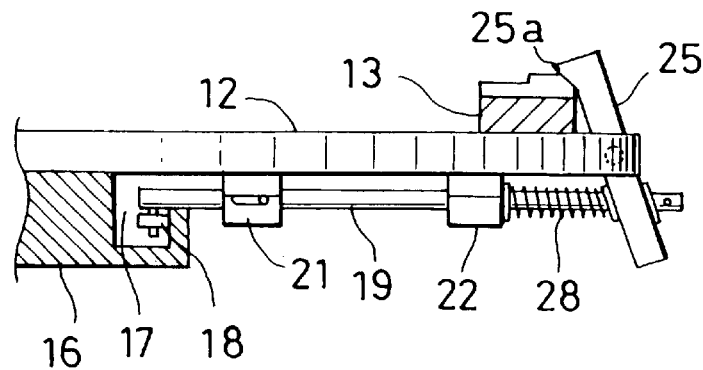
Figure 5A:
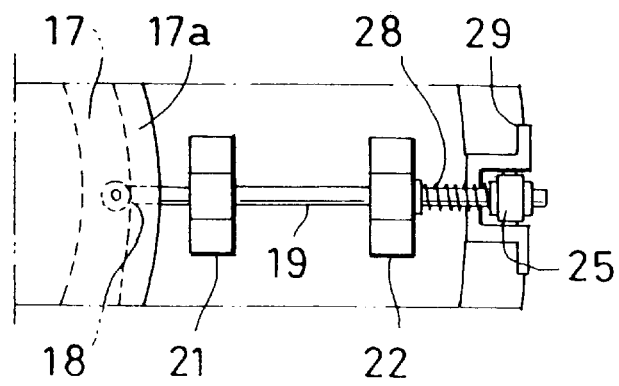
FIG. 5 (A) and FIG. 5 (B) each represents a bottom view for explanation showing operation of the wafer chuck.
Figure 5B:
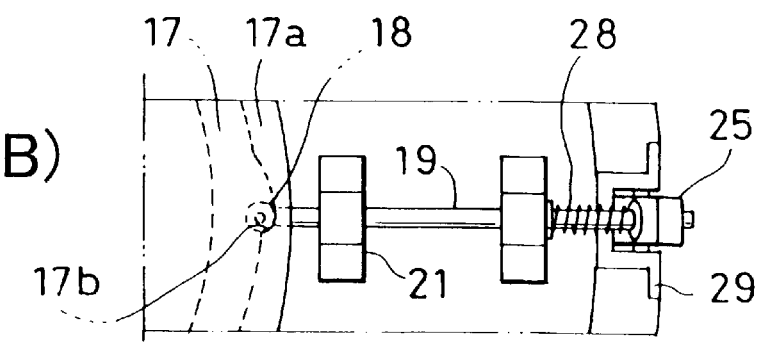

FIG. 4 (A) and FIG. 5 (A) each represents a condition where the wafer is opened, and FIG. 4 (B) and FIG. 5 (B) each shows a condition where the chuck is closed.

The chuck levers 25 are operated all synchronously.

When the chuck disk 16 is set to a wafer opening position, the thickness of the outer wall 17a reaches the maximum, and the chuck shaft 19 is pulled toward the center against the force of the compression spring 28. The lower end of the chuck lever 25 is rotated toward the center, and the wafer presser 25a is rotated and moved in the outward direction. As a result, it is completely separated from the wafer seat 13.

The wafer 7 held by a robot hand (not shown) is placed on the wafer seat 13. An advancing direction of the robot hand is a direction toward the position where the notch 14 is not provided, and interference of the robot hand with the chuck lever 25 can be avoided.

When the chuck disk 16 is rotated in a wafer chuck direction, the thickness of the outer wall 17a is gradually decreased. The chuck shaft 19 is displaced in the outward direction by the resilient force of the compression spring 28. The wafer presser 25a is rotated toward the center, and a peripheral edge of the wafer 7 is pinched between the wafer seat 13 and the wafer presser 25a.

Under the condition where the wafer 7 is pinched, the pin 27 is separated from the washer 26, and a pressing force of the chuck lever 25 on the wafer 7 is determined by the resilient force of the compression spring 28.

It is needless to say that the chuck shaft 19 and the chuck lever 25 are arranged in such manner that good balance is kept when the rotating baseplate 12 is rotated and no vibration occurs.

Figure 6:
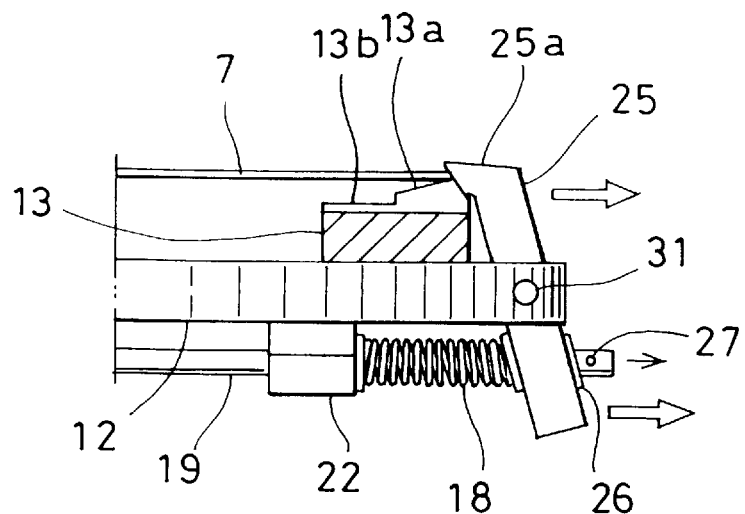
FIG. 6 is a front view of a part of the chuck lever in the first embodiment.
Figure 7:
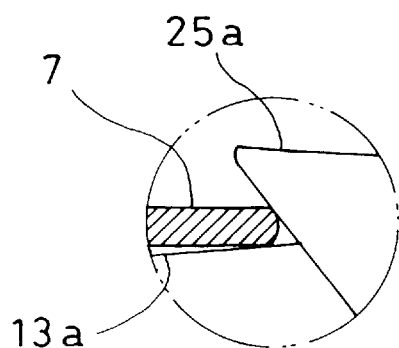
FIG. 7 is an enlarged view showing chucking condition of the wafer in the first embodiment.

Description will be given now on the pinched condition referring to FIG. 6, FIG. 7 and FIG. 8.

As described above, the wafer is pinched by the inclined surface with the downslope gradient toward the center and by the inclined surface with the upslope gradient toward the center. Therefore, the wafer is constrained from movement in two directions, i.e. in a radial direction and a vertical direction in a single step. Because the wafer receiving surface 13a is in the downslope gradient toward the center, automatic aligning force is applied on the wafer 7 to be received on the wafer receiving surface 13a so that the wafer 7 is aligned with the center of the rotating baseplate 12.

Figure 8:
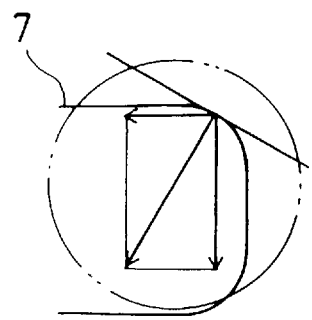
FIG. 8 is an operational drawing showing a force of a wafer chuck in the first embodiment.

When the upslope surface of the wafer presser 25a is brought into contact with the peripheral edge of the wafer 7, horizontal component force toward the center is generated as shown in FIG. 8. Also, an action is generated by this component force to align the wafer 7 with the center.

It is supposed that the wafer 7 is decentered with respect to the wafer seat 13 when the wafer 7 is received. Even in such case, the chuck levers 25 are all synchronously operated when chucking by the chuck levers 25 is performed. Therefore, the wafer presser 25a on the decentered side first touches the wafer 7, and the wafer is moved toward the center. Further, when all of the wafer pressers 25a pinch the wafer 7, alignment with high accuracy can be achieved by the horizontal component force as described above.

Figure 9:
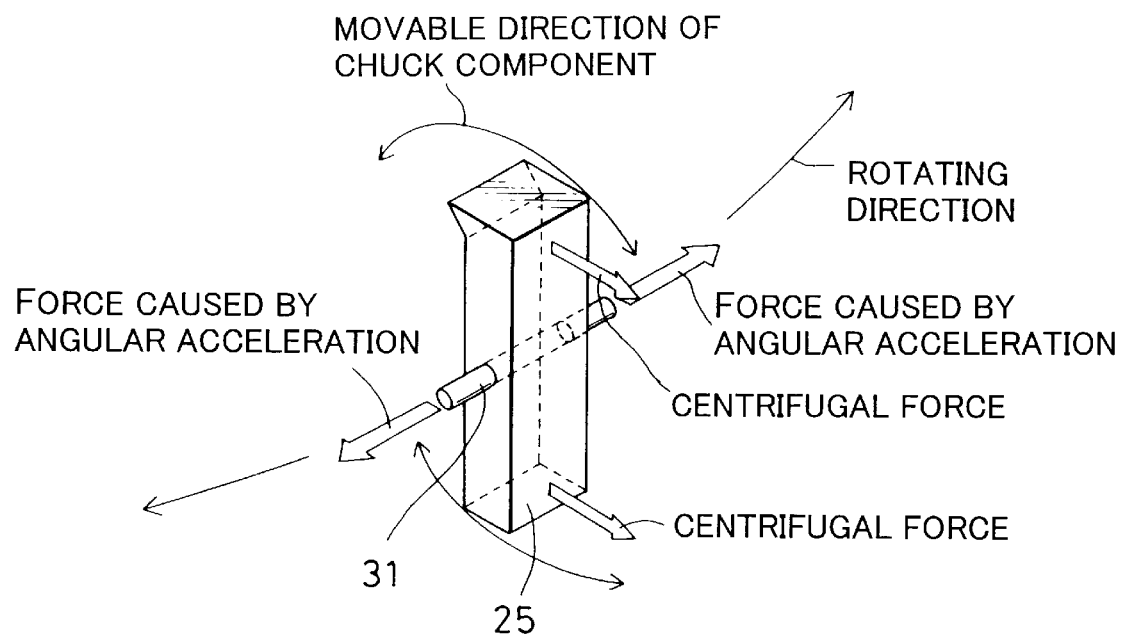
FIG. 9 is an operational drawing showing a force to be applied on a chucked portion of the wafer by rotation in the first embodiment.

Next, when the rotating baseplate 12 is rotated, a force caused by angular acceleration is applied on the wafer holding device as shown in FIG. 9 at the initiation of rotation and at the stopping. During rotation, centrifugal force is applied.

At the initiation of rotation and at the stopping, the force caused by angular acceleration is applied in the tangential direction of the circumference. The pin 31 of the chuck lever 25 is provided in the tangential direction. For this reason, even when the force caused by angular acceleration is applied, no force such as twisting is applied on the chuck lever 25, and the force applied on the chuck lever 25 is supported by the holder 29 via two side surfaces of the chuck lever 25. Accordingly, if backlash between the holder 29 and the chuck lever 25 is eliminated, no deviation of the wafer 7 occurs at the initiation of rotation and at the stopping.

Next, when centrifugal force is applied on the chuck lever 25 during rotation, it is designed in such manner that centrifugal force applied on the lower half of the chuck lever 25 is slightly bigger than centrifugal force applied on the upper half. With increase of the rotating speed, a chucking force by the chuck lever 25 is increased. That is, the higher the rotating speed is, the more firmly the wafer is chucked, and the chucking is not loosened even when centrifugal force is increased.

When the wafer is chucked, there is play as large as a gap between the pin 27 and the washer 26 on the chuck shaft 19. Centrifugal force is also applied on the chuck shaft 19, and stabilization is reached with the cam follower 18 is abutted on the outer wall 17a.

Figure 10:
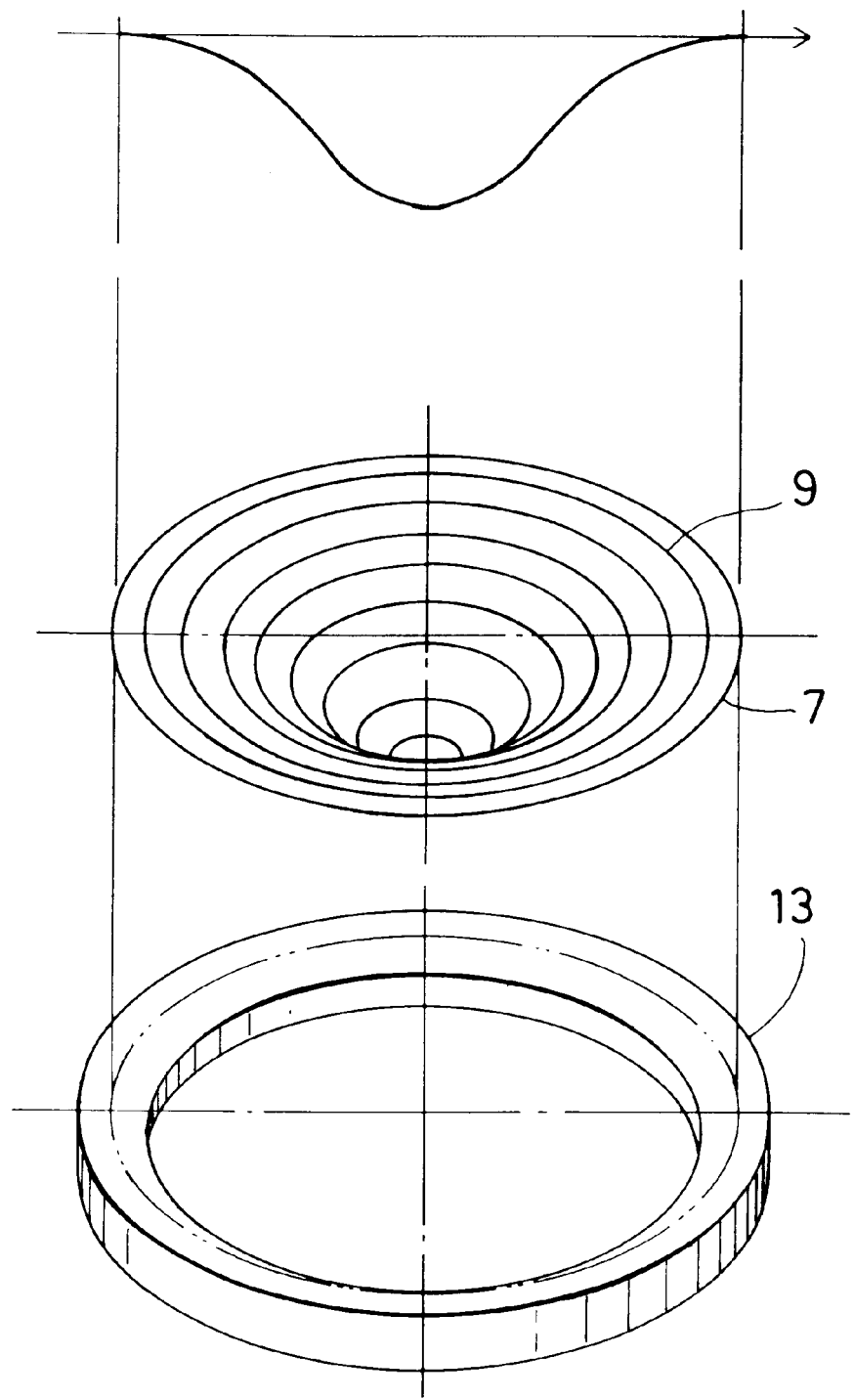
FIG. 10 is a drawing to explain flexed condition of the wafer in the first embodiment.

FIG. 10 shows flexed condition where the wafer 7 is received on the wafer seat 13 and is chucked. The wafer 7 is supported at the peripheral edge by the circumference, and it is smoothly bent or flexed toward the center by its own weight, and contour lines 9 of the flexion are in form of concentric circles.

In the surface inspection of the wafer 7, a laser beam is irradiated and scanned in a circumferential direction. If there is no irregular change in the circumferential direction, no trouble occurs in the inspection. The movement of the laser beam in the radial direction is far slower than rotation of the wafer 7. Thus, even when there may be displacement, it can be easily followed in the detection.

Figure 11:
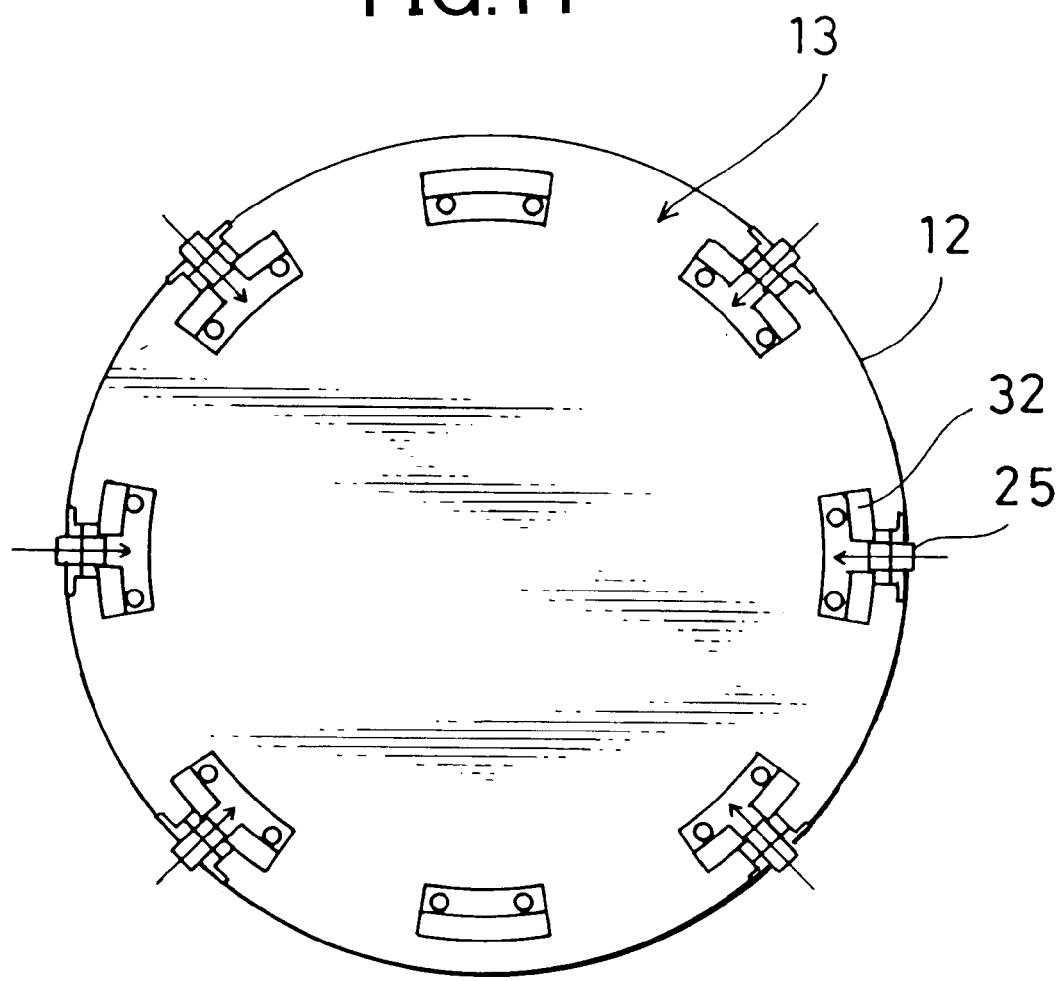
FIG. 11 is a plan view showing another example of a wafer seat in the first embodiment.

In the above first embodiment, the wafer seat 13 is designed as an integrated ring, while the wafer seat 13 may be designed in such manner that partial seats 32 in an arcuate shape may be arranged on the same circumference as shown in FIG. 11. By providing the partial seats 32, the wafer seat 13 may be designed in such manner that the inertial force can be advantageously decreased.

If we consider the flexion when the wafer 7 is received, it is preferable that the partial seats 32 are provided at 8 points or more.

In the first embodiment as described above, the lower surface of the wafer receiving surface 13a and the wafer presser 25a are designed to have a linear cross-section, while it is needless to say that it may be designed to have a curved cross-section.

In the first embodiment as described above, consideration is given on the placement of the wafer by the robot hand, and the wafer dampers 20 are provided at 6 points of 8 equally divided points on the circumference. If we consider the condition such as distortion, it is preferable to chuck the wafer evenly on the circumference when the wafer is chucked.

In the second embodiment as described below, the wafer is chucked evenly on the circumference so that the moving of the wafer by the robot hand can be performed more smoothly.

In FIG. 12 to FIG. 16 showing the second embodiment, the same component as shown in FIG. 1 to FIG. 9 is referred by the same symbol, and detailed description is not given here.

The wafer seat 13 in a ring-like shape is provided on the upper surface of the rotating baseplate 12, and the wafer clampers 20 are arranged at each of 8 equally divided positions on the circumference of the wafer seat 13. A second notch 34 is disposed at each of 4 equally divided points on the circumference of the wafer seat 13 and the second notch 34 is deviated by 22.5° from the position of the notch 14. On each of four of the second notches 34, a wafer hoist 36 of a wafer lifting mechanism 35 is disposed.

In the following, description will be given on the wafer hoist 36.

A guide cylinder 37 is fixed on the second notch 34 of the rotating baseplate 12 from under the second notch so as to penetrate through it, and a delivery pin 38 is slidably engaged with the guide cylinder 37 so that the delivery pin can slide in a vertical direction. The upper end of the delivery pin 38 has an outer edge 38a and a wafer receiving surface 38b inclined with a downslope gradient from the outer edge 38a toward the center.

A guide groove 39 is formed in a vertical direction on the guide cylinder 37, and a pin 41 slidably engaged with the guide groove 39 is erected on the delivery pin 38. By the pin 41 and the guide groove 39, the delivery pin 38 is prevented from turning, and the delivery pin 38 can be moved up or down within the movable range of the pin 41.

Figure 14:
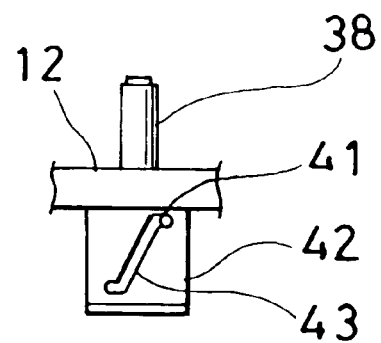
FIG. 14 is a partial side view showing the second embodiment.

A cylinder cam 42 is rotatably engaged on a lower portion of the guide cylinder 37. As shown in FIG. 14, a cam groove 43 is formed on the cylinder cam 42. The cam groove 43 is provided with a predetermined gradient with respect to the generating line of the cylinder cam 42, and an upper end and a lower end of the cam groove are designed in a horizontal direction. The pin 41 is slidably engaged with the cam groove 43.

On the lower surface of the rotating baseplate 12, a link strut 44 is erected, and the link strut 44 is disposed on a line which connects the center of the delivery pin 38 with the center of the rotation shaft 11. A link bar 45 is pivotally mounted on the link strut 44. An oblong hole 49 is formed on an outer end of the link bar 45, and another oblong hole 52 is formed on an inner end.

A bracket 46 is fixed on the cylinder cam 42, and another bracket 47 is fixed on an outer peripheral surface of the chuck disk 16. A pin 48 is fixed on the bracket 46, and a pin 51 is fixed on the bracket 47.

The pin 48 is slidably engaged in the oblong hole 49, and the outer end of the link bar 45 and the bracket 46 are connected via the pin 48. The pin 51 is slidably engaged in the oblong hole 52, and the inner end of the link bar 45 is connected with the bracket 47 via the pin 51.

Figure 12:
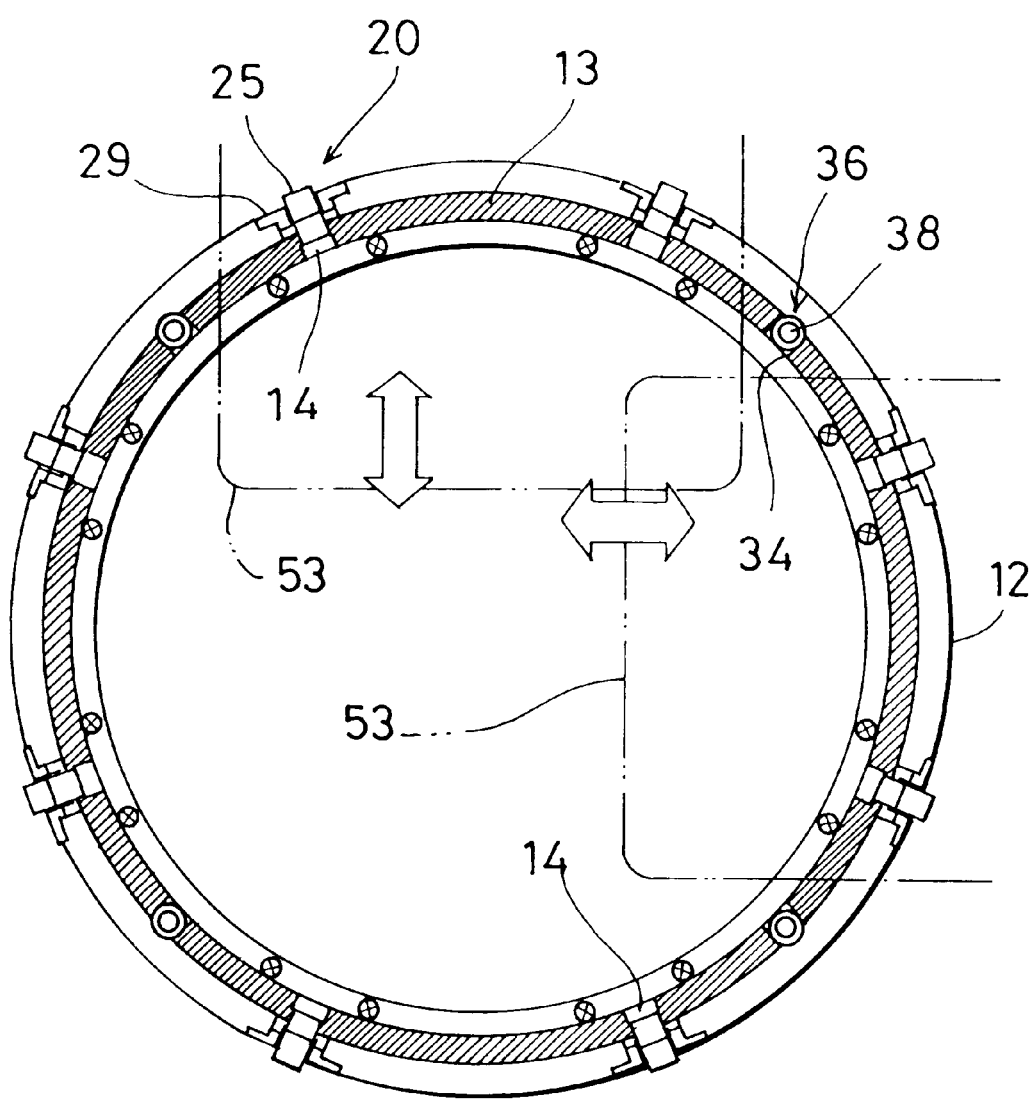
FIG. 12 is a plan view showing a second embodiment of the present invention.
Figure 13:
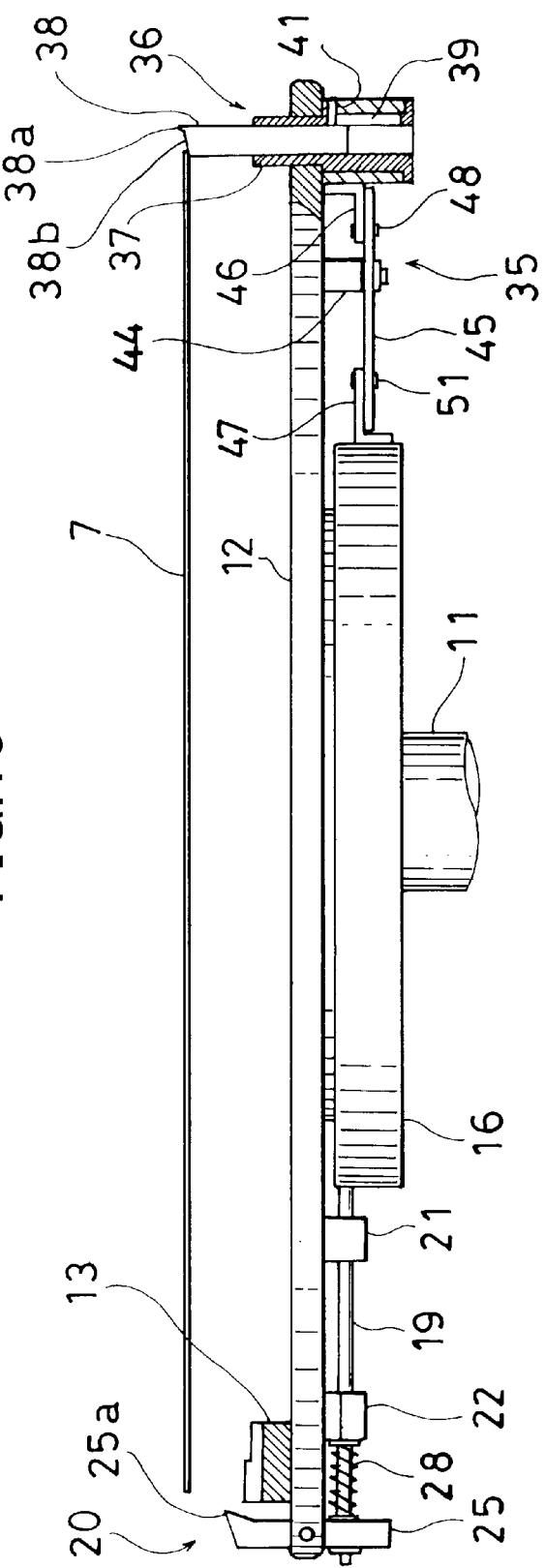
FIG. 13 is a front view of the second embodiment.

In FIG. 12, reference numeral 53 denotes a robot hand. Four of the delivery pins 38 are provided, while 3 delivery pins or 5 or more delivery pins may be provided so far as these can support the wafer.

Now, description will be given on the delivery of the wafer in the second embodiment.

When the wafer 7 is received from the robot hand 53, the chuck lever 25 is erected, and the wafer presser 25a is separated from the wafer seat 13, and the delivery pin 38 is in a protruded and elevated position. (See FIG. 13.) When the delivery pin 38 is protruded, the pin 41 is on the horizontal portion at the upper end of the cam groove 43, and the cylinder cam 42 is rotated clockwise as seen in FIG. 15.

The wafer 7 is placed on the upper end of the delivery pin 38 by the robot hand 53, and the wafer 7 is supported by four delivery pins 38. The wafer 7 is positioned above the wafer seat 13 so that the robot hand 53 does not interfere with the chuck lever 25.

Figure 15:
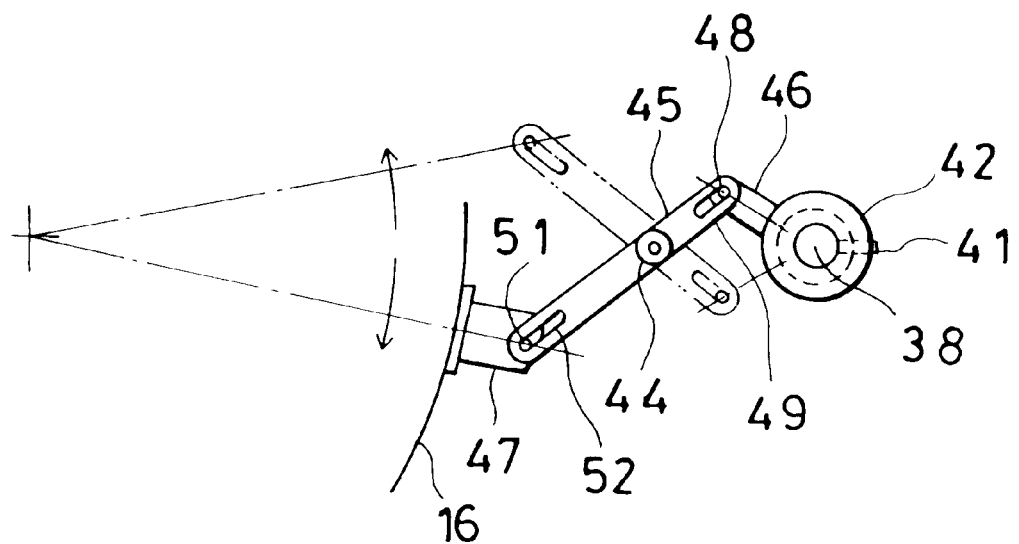
FIG. 15 is a partial bottom view of the second embodiment.
Figure 16:
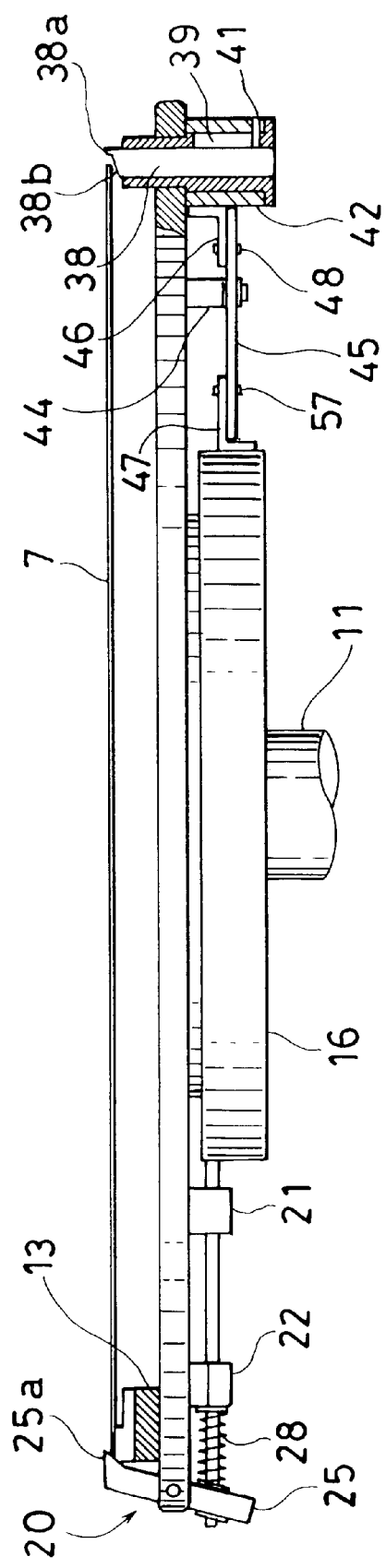
FIG. 16 is a front view showing operation of the second embodiment.

The robot hand 53 is moved backward, and the chuck disk 16 is rotated at a predetermined angle in a counterclockwise direction in FIG. 15. By the rotation of the chuck disk 16, the cylinder cam 42 is rotated via the link bar 45 in the counterclockwise direction in FIG. 15. By the rotation of the cylinder cam 42, the pin 41 is moved downward along the cam groove 43, and the delivery pin 38 is moved down. When the delivery pin 38 is moved down and the wafer 7 is placed on the wafer seat 13, the cam follower 18 is displaced synchronously to the outer side along the cam groove 17 (FIG. 5 (A) and FIG. 5 (B)). The chuck lever 25 chucks the wafer 7 by the force of the compression spring 28 (FIG. 16).

The rotating baseplate 12 is rotated, and the surface inspection for the wafer 7 is performed.

When the wafer 7 is moved out after the inspection, the above procedure is reversed.

As described above, in the second embodiment, the wafer 7 is clamped evenly over the total circumference by the wafer clamper 20, and this prevents generation of the distortion.

Figure 17:
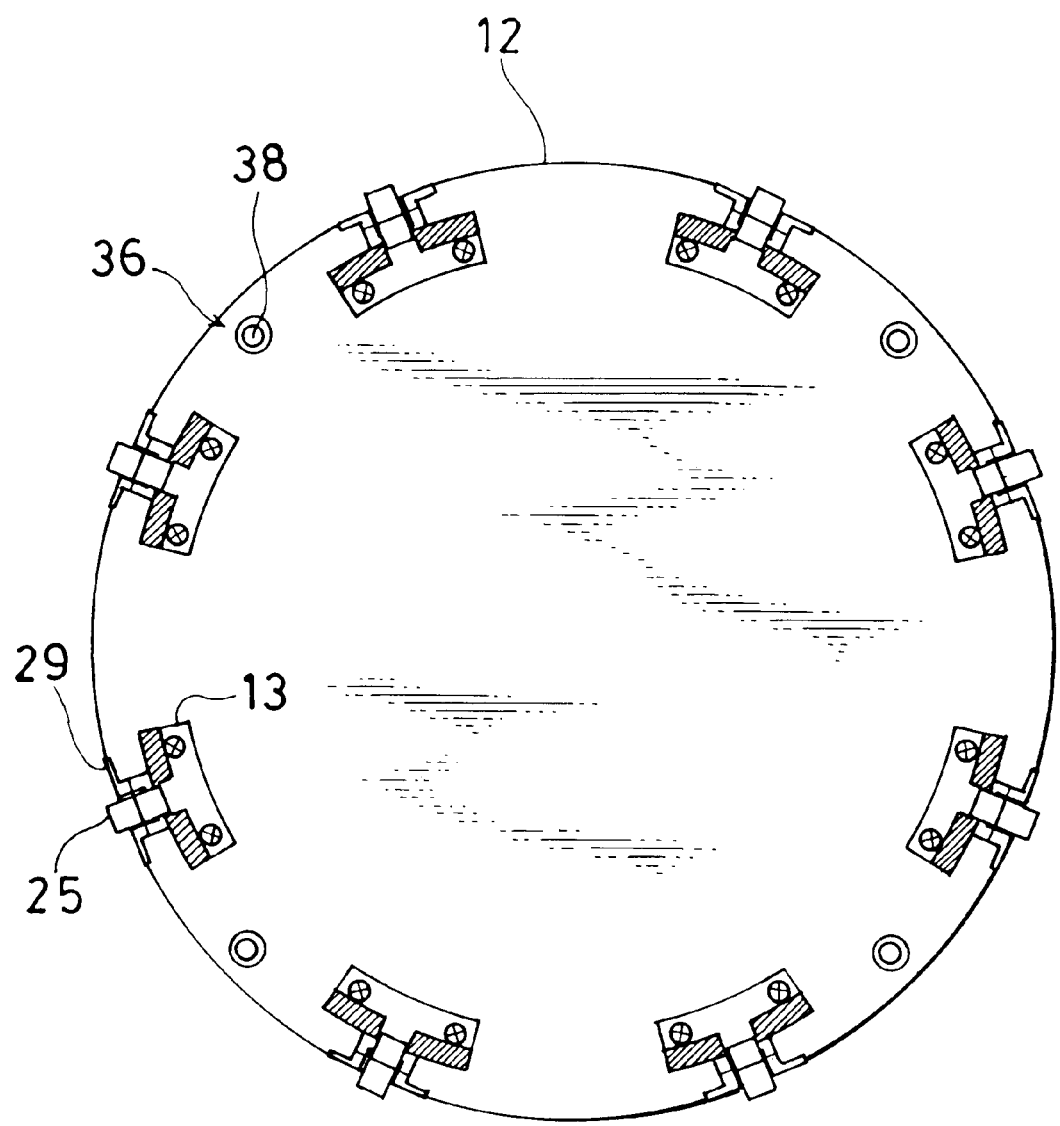
FIG. 17 is a plan view showing another example of a wafer seat in the second embodiment.
Figure 18:
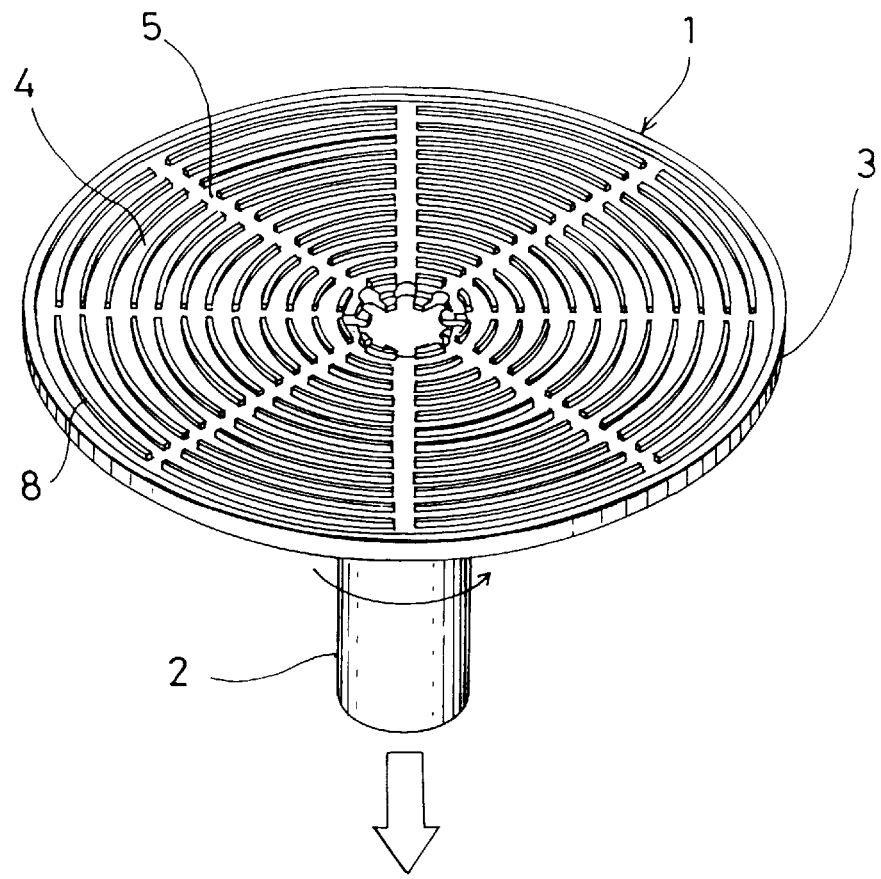
FIG. 18 is a perspective view of a wafer chuck in a conventional example.
Figure 19:
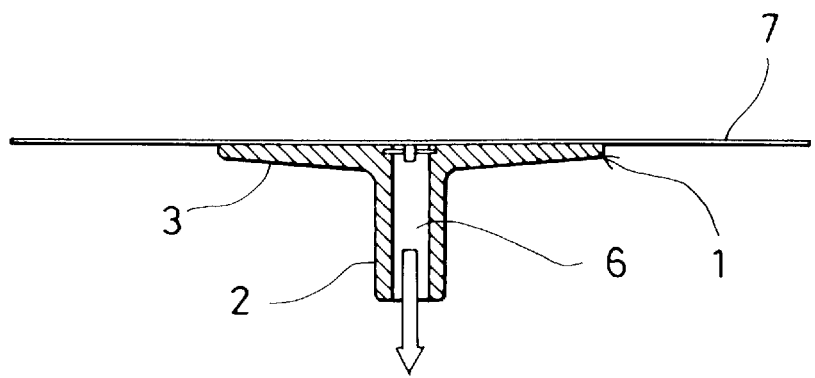
FIG. 19 is a sectional elevation view of the conventional example.
Figure 20:
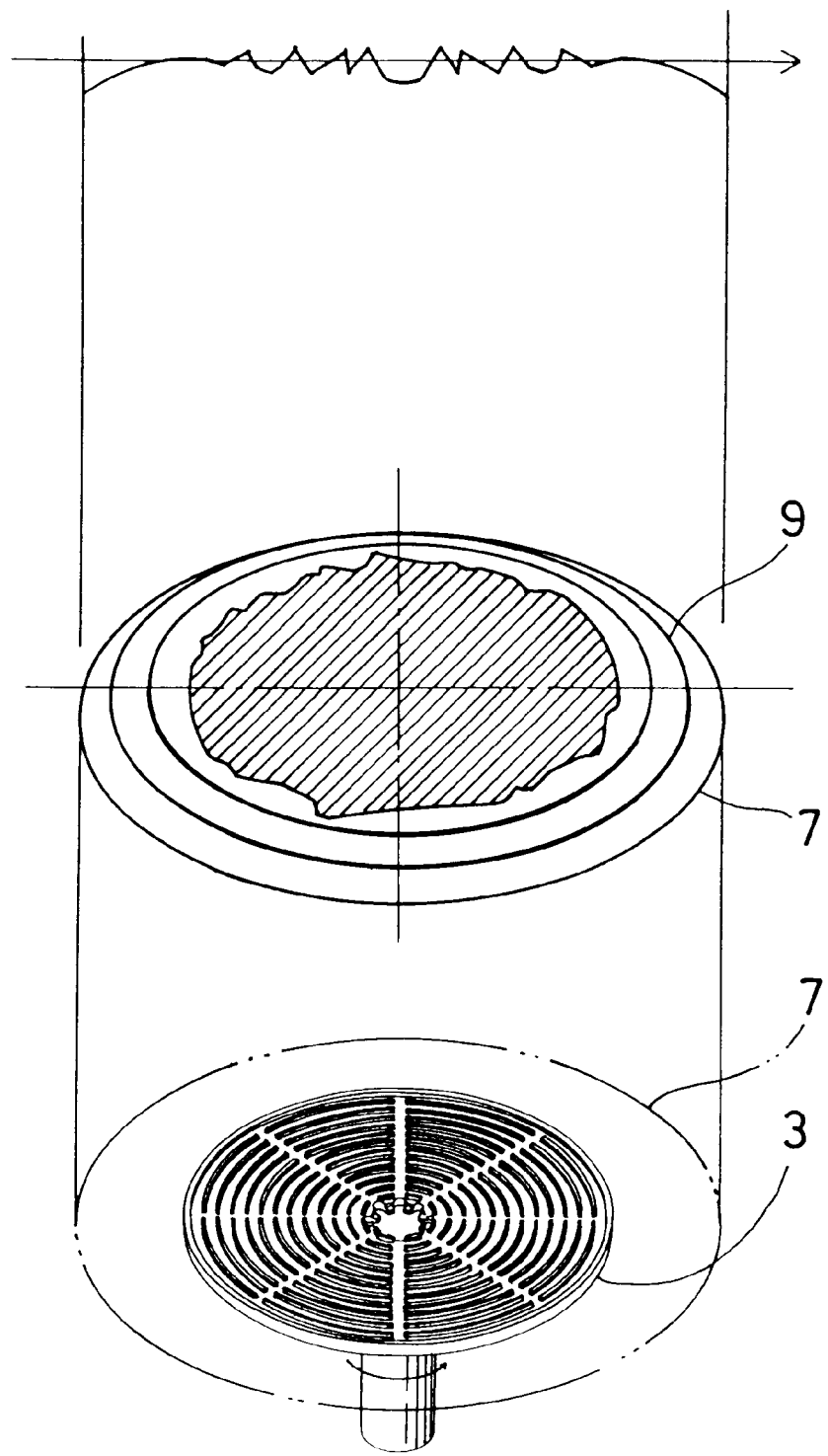
FIG. 20 is a drawing to explain flexed condition of the wafer in the conventional example.

FIG. 17 shows an arrangement of the wafer seat 13 where the partial seats 32 in an arcuate shape are disposed on the same circumference instead of the wafer seat 13 designed in an integrated ring form. What is shown in FIG. 17 has the same meaning as the one shown in FIG. 11. By designing the seat in the partial seats 32, it is advantageous that an inertial force is decreased.

According to the present invention, a wafer holding device is provided, which comprises a rotating baseplate, a wafer seat which is provided on the rotating baseplate coaxially with the rotating baseplate and which receives a peripheral edge of a wafer by a circumference, a predetermined number of chuck levers rotatably mounted on the wafer seat so that the chuck levers can be rotated around an axis extending in a tangential direction on a circumference of the rotating baseplate, and springs for resiliently pushing an end of the chuck lever toward the wafer seat, wherein the peripheral edge of the wafer received on the wafer seat is pinched by the wafer seat and the chuck lever. As a result, irregular deformation does not develop on the wafer received on the wafer seat, and the wafer can be reliably held even at the time of sudden rotation, stopping or during high-speed rotation. The edge of the wafer can be pinched without touching the front or rear surface of the wafer, and it is possible to prevent attachment of foreign objects or to avoid damage on the front and rear surfaces of the wafer.

What is claimed is:

1. A wafer holding device, comprising a rotating baseplate, a wafer seat which is provided on said rotating baseplate coaxially with said rotating baseplate and which receives a peripheral edge of a wafer by a circumference, a predetermined number of chuck levers rotatably mounted on said wafer seat so that said chuck levers can be rotated around an axis extending in a tangential direction on a circumference of said rotating baseplate, and springs for resiliently pushing an end of said chuck lever toward said wafer seat, wherein said chuck lever is extended above and under said rotating baseplate, an outer end of a chuck shaft slidably provided in a radial direction is engaged with a lower end of said chuck lever, an inner end of the chuck shaft is engaged with a chuck disk provided coaxially with said rotating baseplate, the chuck shaft is displaced in the radial direction by rotation of the chuck disk, and said chuck lever is rotated, wherein said peripheral edge of the wafer received on said wafer seat is pinched by said wafer seat and said chuck lever.

2. A wafer holding device according to claim 1, wherein a wafer receiving surface of said wafer seat has a downslope gradient toward a center of the rotating baseplate, and a wafer abutting surface of said chuck lever has an upslope gradient toward said center.

3. A wafer holding device, comprising a rotating baseplate, a wafer seat which is provided on said rotating baseplate coaxially with said rotating baseplate and which receives a peripheral edge of a wafer by a circumference, a predetermined number of chuck levers rotatably mounted on said wafer seat so that said chuck levers can be rotated around an axis extending in a tangential direction on a circumference of said rotating baseplate, and springs for resiliently pushing an end of said chuck lever toward said wafer seat, wherein said peripheral edge of the wafer received on said wafer seat is pinched by said wafer seat and said chuck lever, and wherein said wafer seat has at least three notches, and there is provided a delivery pin which is positioned on each of said notches, which is movable in a vertical direction on the same circumference as said wafer seat, and which receives the wafer above said wafer seat.

4. A wafer holding device according to claim 1, wherein centrifugal force applied on a lower half of said chuck lever is designed to be bigger than centrifugal force applied on an upper half of said chuck lever.

5. A wafer holding device according to claim 1, wherein said wafer seat has at least three notches, and there is provided a delivery pin which is positioned on each of the notches, which is movable in a vertical direction on the same circumference as said wafer seat, and which receives the wafer above said wafer seat.

6. A wafer holding device according to claim 5, wherein said device comprises a cylinder cam rotatably mounted with respect to said delivery pin, a chuck disk rotatably provided coaxially with said rotating baseplate, and a link bar for connecting said chuck disk with said cylinder cam, wherein said cylinder cam is rotated via said link bar by rotation of said chuck disk, and said delivery pin is moved up or down by rotation of the cylinder cam.

7. A wafer holding device according to claim 3, wherein centrifugal force applied on a lower half of said chuck lever is designed to be bigger than centrifugal force applied on an upper half of said chuck lever.

8. A wafer holding device according to claim 3, wherein a wafer receiving surface of said wafer seat has a downslope gradient toward a center of the rotating baseplate, and a wafer abutting surface of said chuck lever has an upslope gradient toward said center.

* * * * *